US009659132B2

(12) United States Patent
Kerre et al.

(10) Patent No.: US 9,659,132 B2
(45) Date of Patent: May 23, 2017

(54) METHOD OF GENERATING A TARGET LAYOUT ON THE BASIS OF A SOURCE LAYOUT

(71) Applicants: Alexander Leonidovich Kerre, Solnechnogorsk (RU); Mikhail Anatolievich Sotnikov, Moscow (RU)

(72) Inventors: Alexander Leonidovich Kerre, Solnechnogorsk (RU); Mikhail Anatolievich Sotnikov, Moscow (RU)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/890,961

(22) PCT Filed: Jun. 6, 2013

(86) PCT No.: PCT/RU2013/000468
§ 371 (c)(1),
(2) Date: Nov. 13, 2015

(87) PCT Pub. No.: WO2014/196889
PCT Pub. Date: Dec. 11, 2014

(65) Prior Publication Data
US 2016/0103940 A1    Apr. 14, 2016

(51) Int. Cl.
*G06F 17/50*    (2006.01)
(52) U.S. Cl.
CPC ........ *G06F 17/5072* (2013.01); *G06F 17/505* (2013.01); *G06F 17/5068* (2013.01)

(58) Field of Classification Search
USPC ....................................................... 716/122
See application file for complete search history.

(56) References Cited

U.S. PATENT DOCUMENTS

| 7,568,173 | B2 | 7/2009 | Gernhoefer et al. | |
| 7,587,694 | B1 * | 9/2009 | Henrickson | G06F 17/505 716/122 |
| 9,122,834 | B1 * | 9/2015 | Caluya | G06F 17/5081 |

(Continued)

OTHER PUBLICATIONS

International Search Report and Written Opinion correlating to PCT/RU2013/000468 issued on Mar. 12, 2014.

(Continued)

*Primary Examiner* — Mohammed Alam (57) ABSTRACT

Generating a target layout of an integrated circuit includes providing a source layout comprising one or more source pcells having one or more shapes; providing a set of connectivity constraints for connecting each shape of each source pcell to none, one, or more other components of the integrated circuit; for each shape of each source pcell, determining a corresponding target shape having a contour composed of edges with defined lengths, inserting none, one, or more edges into the contour of the shape, or into the contour of the corresponding target shape, determining a corresponding edge of the corresponding target shape; for each edge, defining an edge length constraint for constraining the edge to have the length of the edge of the corresponding target shape; applying a legalization procedure to the source layout based on the connectivity constraints, the target design constraints, and the edge length constraints.

5 Claims, 4 Drawing Sheets

(56) References Cited

U.S. PATENT DOCUMENTS

| | | | |
|---|---|---|---|
| 2008/0016476 A1* | 1/2008 | Chan | G06F 17/5068 |
| | | | 716/122 |
| 2008/0016483 A1* | 1/2008 | Chan | G06F 17/5068 |
| | | | 716/122 |
| 2008/0222578 A1 | 9/2008 | Joshi | |
| 2009/0064061 A1* | 3/2009 | Gernhoefer | G06F 17/5072 |
| | | | 716/132 |
| 2012/0304139 A1* | 11/2012 | Chen | G06F 17/5072 |
| | | | 716/111 |

OTHER PUBLICATIONS

Serras, J. and Miguel Silveira, L., "Hierarchical analog layout migration with pcells", 17th IFIP International Conference on Very Large Scale Integration (VLSI-SoC), 2009.

Batterywala, S.H. et al., "Cell Swapping Based Migration Methodology for Analog and Custom Layouts", 9th International Symposium on Quality Electronic Design, 2008.

* cited by examiner

METHOD OF GENERATING A TARGET LAYOUT ON THE BASIS OF A SOURCE LAYOUT

FIELD OF THE INVENTION

This invention relates to a method of generating a target layout on the basis of a source layout.

BACKGROUND OF THE INVENTION

A layout specifies the components of an integrated circuit (IC) and their positions within the IC. A pcell is a parametrized cell representing a part or a component of the IC. A pcell may include a collection of shapes. Each shape may belong to one of several technology layers of the IC. Each pcell layout, not an individual shape within the pcell, may have certain pcell parameter values associated with it. The pcell parameter values may be used as input data for a pcell program which can be executed to generate a pcell layout.

A pcell may, for example, be implemented in the form of an executable script. A pcell usually includes a set of parameters for defining properties of the components represented by the pcell. A layout may include one or more than one instance of one or more than one pcell. For example, a first instance of a pcell may represent a first component, e.g., a first subcircuit, and a second pcell may represent another component of the same IC.

Current methods of process migration of layouts with pcells do not necessarily preserve pcell connectivity in the migrated layout Known automatic methods of connectivity correction do not necessarily fix all violations and a manual correction effort may be needed. This effort can be substantial.

Figure 1:
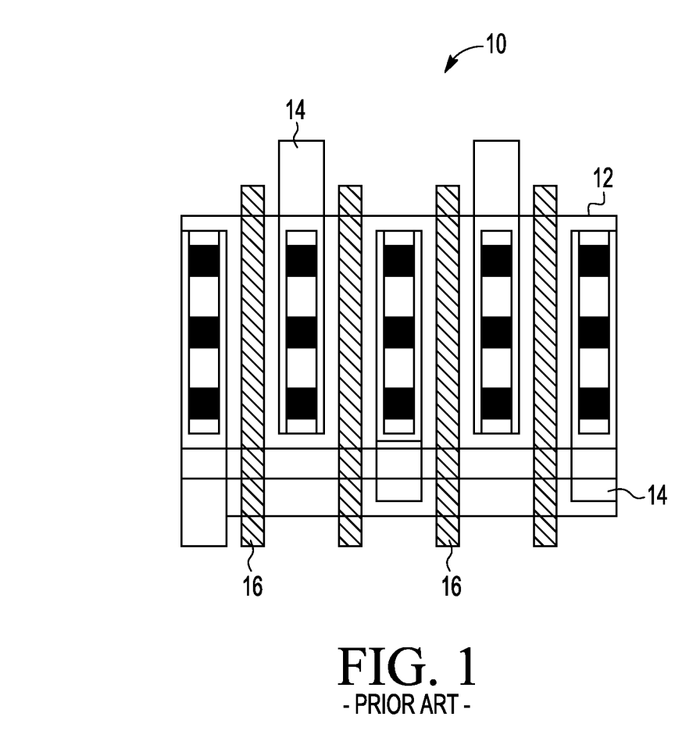
FIG. 1 schematically shows an example of a source layout.
Figure 2:
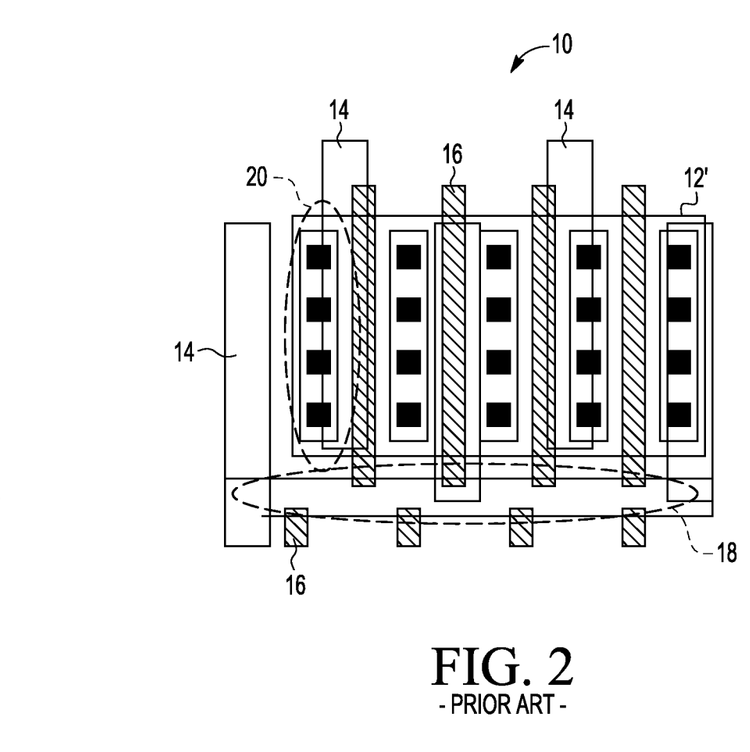
FIG. 2 schematically shows an example of the source layout after an operation of cell-swapping.

Referring to FIGS. 1 and 2, an example of a source layout before (FIG. 1) and after (FIG. 2) a cell swapping operation is described. The layout 10 may comprise a plurality of electronic components such as conductors, inductors, capacitors, and semiconductor based components. In the present example, the layout comprises one or more conductors 14 arranged in a first layer and one or more conductors 16 arranged in a second layer of the integrated circuit. A pcell 12 may specify one or more portions of the shown circuitry, e.g., the conductors 14 and 16, or portions thereof. For instance, each of the conductors 14 and 16 may have a segment defined by the pcell 12.

The aim of a process migration may be seen in converting a layout from one technology node to another. In this process, the layout may have to be modified to meet design rules of the target technology while preserving layout connectivity and minimizing layout changes. The design rules may specify conditions such as minimum distances between conductors, minimum or maximum widths of conductors, and other length or size constraints.

Custom layouts may be created using pcells. A pcell may, for example, be implemented as a script for generating a layout based on user-defined parameters. During migration, a source pcell may be replaced by a target pcell. This process is known as cell swapping. In many cases, cell swapping may introduce connectivity violations that may require manual attention. Notably, it may be insufficient to adapt the values of the parameters of a pcell.

For instance, now turning to FIG. 2, replacing the pcell 12 of the source technology by a pcell 12' of the corresponding target technology may result in discontinuities of, e.g., the conductors 16 in a region 18 or in shorts between components defined by the pcell 12' and components not defined by the pcell 12' in region 20.

Figure 3:
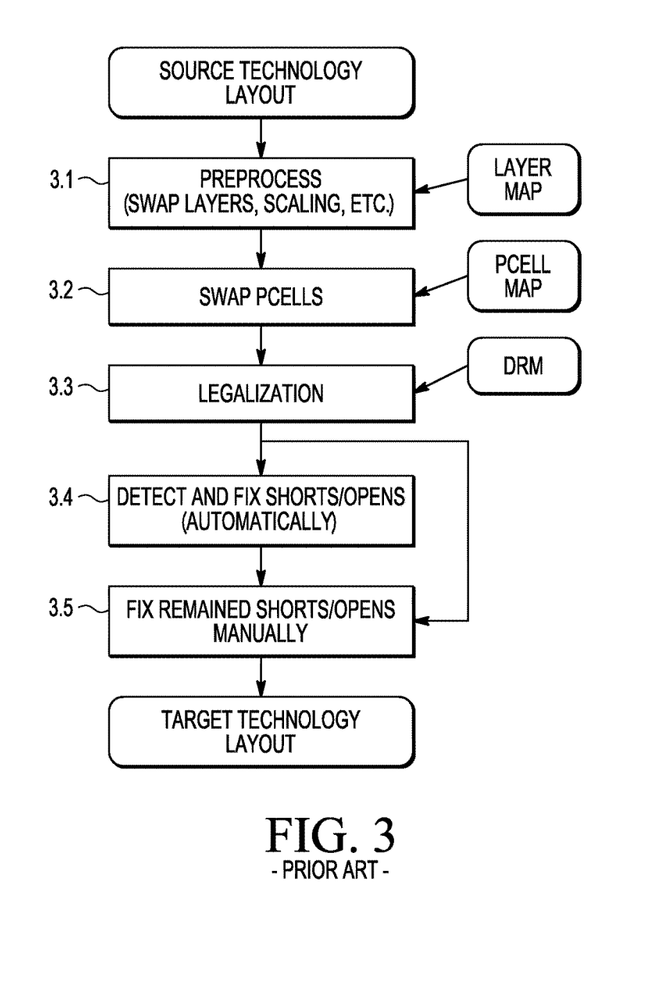
FIG. 3 shows a flowchart of an example of an embodiment of a method of generating a target layout.

FIG. 3 shows a flowchart of an example of a known method of converting a layout from a source technology to a target technology. The method may use as input data, the layout relating to the source technology (also referred to herein as the source technology layout or the source layout), a layer map, a pcell map, and a set of design rules as specified in, e.g., a design rule manual (DRM). The source layout may comprise one or more than one layers. A layer is a flat region in which components of the integrated circuit may be arranged. The integrated circuit may, however, comprise components located in more than one layer. Several layers may be stacked atop each other to form the integrated circuit. The layer map may indicate for each layer of the source layout a corresponding layer of the transformed layout. The correspondence between source layers and target layers may be one-to-one. Each source layer may thus have associated with it precisely one target layer and vice versa. The ordering of the layers, i.e., the sequence in which they are stacked, may however be different in the source layout compared to the target layout.

The pcell map may indicate for each pcell of the source layout a target pcell into which the source pcell is to be transformed. The pcell mapping thus defined is not necessarily bijective. For instance, two different source pcells may be mapped onto the same target pcell.

In a first block 3.1, the source layout may be preprocessed. For example, the layers of the source layout (the source layers) may be rearranged in accordance with the layer map. The source layers may thus be reordered in accordance with the target technology. Furthermore, the pcells of the source layout may be replaced by their counterpart pcells as specified by the pcell map (block 3.2). A legalization procedure (block 3.3) may then be applied to the modified source layout resulting from blocks 3.1 and 3.2. The legalization procedure may include determining geometric parameters of the source layout in accordance with the target design rules. The blocks 3.1, 3.2, and 3.3 may result in connectivity violations such as shorts or opens. Some, but not necessarily all of these violations may be detected and fixed automatically. The remaining connectivity violations may be fixed manually (block 3.5). Blocks 3.1 to 3.5 may thus transform the source layout into the target layout.

The input data, the operations carried out on the input data, and the resulting output data for the various blocks shown in FIG. 3 may be summarized as follows:

Preprocessing (block 3.1). Input: layout, layer map. The layer map may be used to rename source technology layers to target. Other operations such as scaling may be performed. Output: preprocessed layout.

Swapping pcells (block 3.2). Input: preprocessed layout, pcell map. Pcell map is used to swap source pcells with target ones. Output: preprocessed layout with swapped pcells and added connectivity violations.

Legalization (block 3.3). Input: preprocessed layout with swapped pcells and connectivity violations, DRM. DRM is used to create constraints in constraint graph based algorithm. Output:
  migrated layout with connectivity violations.

Detecting and fixing shorts/opens (automatically) (block 3.4). Input: migrated layout with connectivity violations. Some violations are not fixed automatically. Output: migrated layout with connectivity violations.

Fixing remaining shorts/opens manually (block 3.5). Input: migrated layout with connectivity violations. Output: migrated layout.

SUMMARY OF THE INVENTION

The present invention provides a method of generating a target layout on the basis of a source layout as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 4:
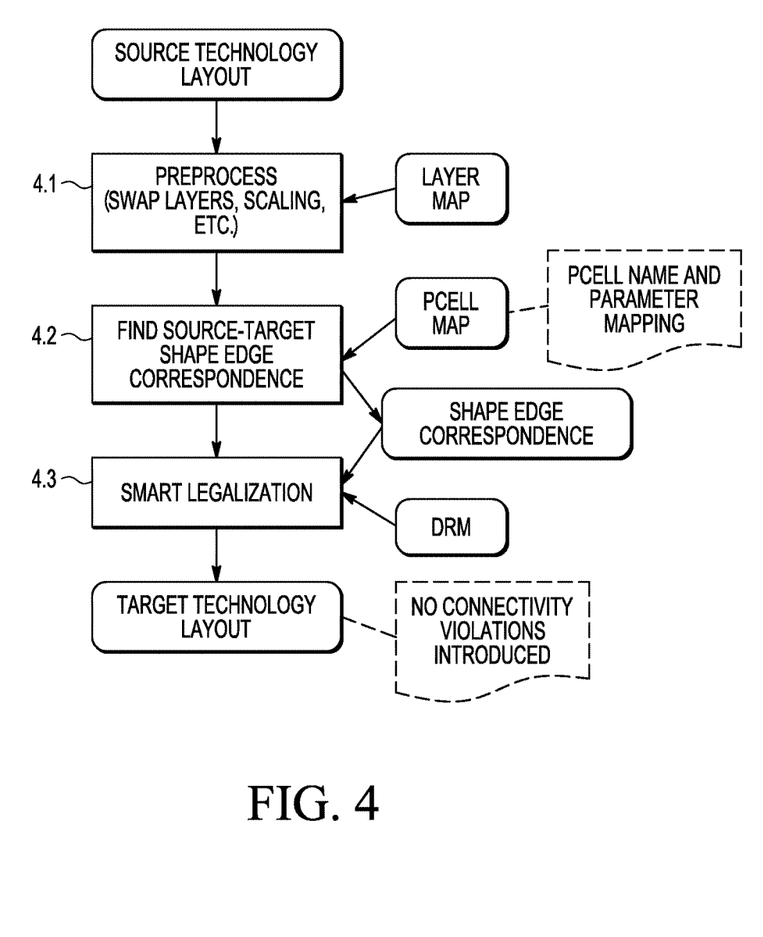
FIG. 4 shows a flowchart of an example of an embodiment of a method of generating a target layout.

Referring now to FIG. 4, an example of a second method of transforming a source layout into a target layout is described. The method may be performed using, for example, a layer map and a set of design rules as input data. The layer map, the pcell map, and the set of design rules may be identical or similar to the ones described above in reference to FIG. 3. The source layout may first be pre-processed (block 4.1) in a manner similar or identical to block 3.1 described above. In a subsequent block 4.2, a correspondence between edges of shapes in the source layout and edges of shapes in the target layout may be determined. A shape may represent the contour or boundary of a component of the integrated circuit described by the source layout. For instance, a straight conductor may be represented by a narrow rectangular shape. Any shape may be defined in terms of a sequence of corners. Each corner may be connected to the subsequent corner by an edge. The last corner of the sequence may be connected to the first corner of the sequence by an edge. An edge is a straight connecting line between two corners.

In the context of determining an edge correspondence between two shapes using a longest common subsequence (LCS) algorithm, a corner may be defined as a turn between a current edge and the next edge of a shape, when walking by the shape contour, e.g., in a clockwise direction. There may be several types of turns, e.g., left-to-bottom, left-to-top, top-to-right, and so on. These types may constitute the alphabet for the LCS algorithm.

The block 4.2 of "finding a source-target shape edge correspondence" may also include adding new corners to the source shapes. If an edge is missing, it may be created to ensure that each source layout edge has a corresponding target layout edge and vice versa.

In a subsequent block 4.3, a smart legalization procedure may be performed on the basis of the source-target shape edge correspondence determined in block 4.2 and the set of target design rules. In the smart legalization procedure, no formal distinction between original corners and newly added corners of the source shapes is made. In other words, the original corners and the newly added corners are treated in the same manner. A target technology layout with no connectivity violations may thus be generated. A need for manually fixing shorts or opens can thus be avoided.

The input data, the operations carried out on the input data, and the resulting output data of the blocks 4.1 to 4.3 may be summarized as follows:

Preprocessing (block 4.1). Input: layout, layer map. The layer map may used to rename source technology layers to target. Other operations such as scaling may be performed. Output: preprocessed layout.

Finding a source-target shape edge correspondence (block 4.2). Input: preprocessed layout, pcell map. The pcell map may be used to obtain a target pcell layout for each source pcell and also to determine edge correspondence data. Output: edge correspondence data.

Smart legalization (block 4.3). Input: preprocessed layout, DRM, edge correspondence. DRM and edge correspondence data are used to create constraints to be used in, e.g., a constraint graph based algorithm. Output: migrated layout.

In a constraint graph based method, constraints may set minimum and maximum distances between edges. In one example of a data model, each edge may have a next edge and a previous edge (with respect to a tour along the contour of the shape in a certain direction, e.g., in a clockwise direction). Constraints between the next and previous edges may control the distance between the next and previous edges as well as the length of the edge of interest. To set an exact edge length, both minimum and maximum constraint between previous and next edges may be set equal to the desired edge length. As a result of smart legalization, each source pcell edge may thus assume the length of the corresponding target pcell length.

In contrast, the numerical values of pcell parameters are not defined by the smart legalization procedure. Rules for calculating target pcell parameters on the basis of source pcell parameters may be stored in the pcell map. According to these rules, target pcell parameters may be equal to source pcell parameters or calculated by a formula based on source pcell parameters. The pcell map may be created by the user.

The smart legalization procedure serves to enforce design rules in addition to setting the lengths of source edges equal to target lengths. It is noted that only setting the lengths of edges of a source shape equal to target lengths and not taking account of neighbor shapes would be equivalent to pcell swapping and, in general, would result in design rule violations. In contrast, the smart legalization procedure may take neighboring shapes into account. Smart legalization may include computing new positions and sizes of neighbor shapes in a way that preserves connectivity and ensures that the layout conforms to the target design rules.

In other words, the smart legalization procedure preserves connections. Special constraints may be created to preserve connections of shapes. These constraints may be referred to as connectivity preservation constraints. Connectivity preservation constraints may be created for all connecting shapes, including pcell shapes.

In the smart legalization procedure, pcell shapes may thus be modified by two drivers, namely the target technology rules and the connectivity preservation constraints. Since the target pcell already satisfies the target technology rules, there is no conflict between these two drivers.

It is recalled that pcell swapping as described above in reference to FIGS. 1 to 3 may create connectivity violations before the legalization procedure. In contrast, the method described in reference to FIGS. 4 to 11 does not generate any connectivity violations, neither before nor in the legalization procedure.

Figure 5:
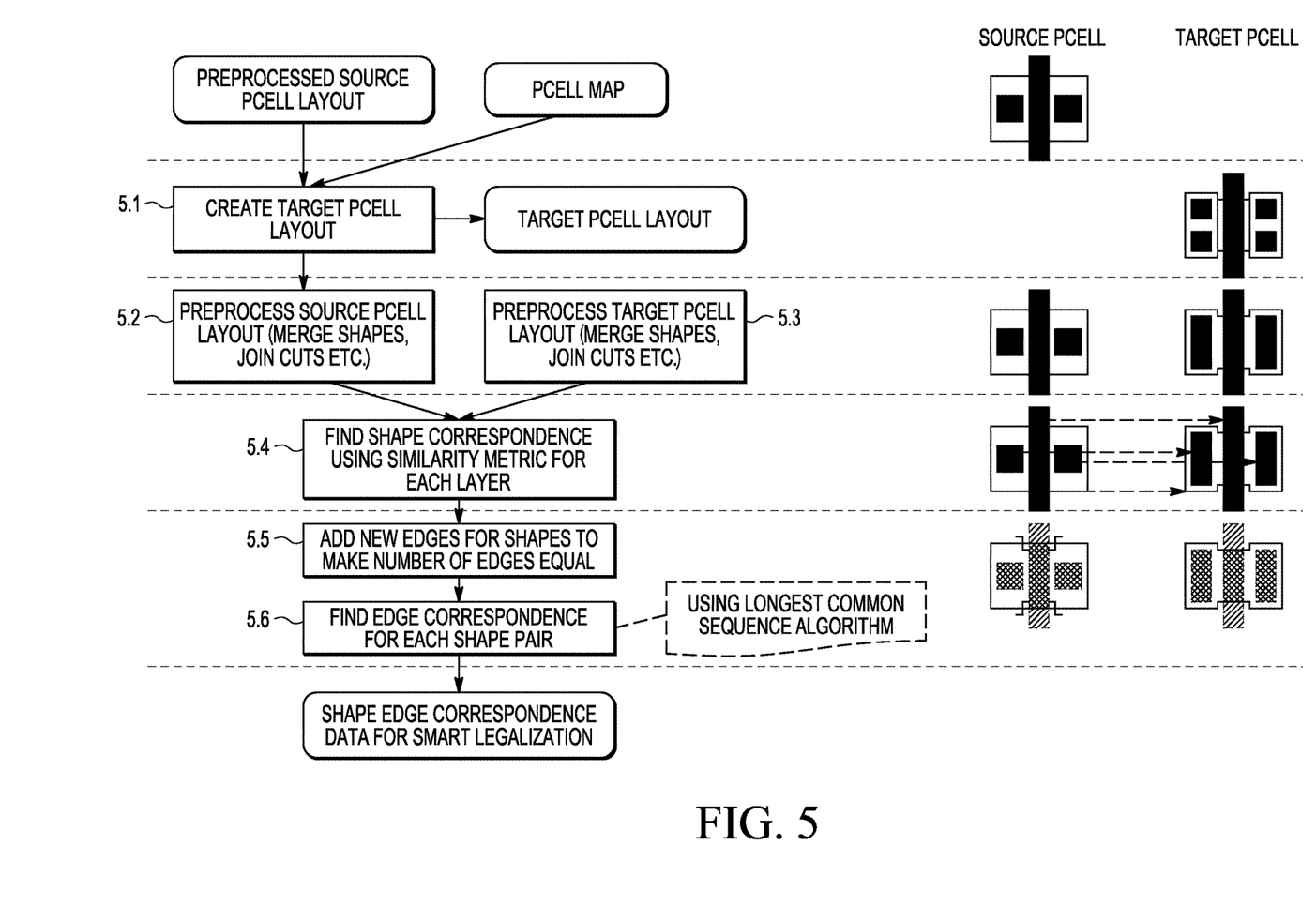
FIG. 5 shows a flowchart of an example of an embodiment of a method of determining a correspondence between shape edges of a source pcell and a target pcell.

Turning now to FIG. 5, the method described above in reference to FIG. 4 is further explained. Starting from the pre-processed source pcell layout (generated in block 4.1, see FIG. 4) and the pcell map, a target pcell layout is created (5.1). The source pcell layout may be further pre-processed in block 5.1. For instance, shapes may be merged, cuts may be joined, and other geometrical transformations may be performed. Furthermore, the target pcell layout may be pre-processed (block 5.3). For example, shapes may be merged, cuts may be joined, and other geometrical transformations may be performed.

Cuts may be merged, for example, based on additional knowledge from, e.g., a design rule manual. Cut shapes which connect the same layers, belong to one electrical net, and are located sufficiently close to each other may form a group. Conductors connected by these cuts may correspond to an electrical net in, e.g., a netlist of the layout. A group of cuts may be a matrix of square cut shapes with equal spacing between them. The number of cuts in corresponding groups may be different for source and target pcells. In order to simplify finding the correspondence between source shapes and target shapes, the cut shapes of a group may be merged before legalization. Furthermore, merged cut shapes may be split back to individual cuts after completing the legalization. The same merging procedure may be applied to other interconnecting layers. An interconnecting layer provides a connection between upper and lower layers. For example, a VIA1 interconnecting a layer M1 and an upper layer M2 may be considered an interconnecting layer. Many other kinds of layers may be viewed as interconnecting layers. The layer M3, for example, may interconnect different devices.

In the right part of the Figure, an example of a source pcell and a target pcell derived therefrom is shown schematically for the various stages of the flowchart in the left part of the Figure. For each layer, a shape correspondence using a similarity metric may be determined. The metric may be defined as a measure of similarity of two shapes, namely a first shape from the source pcell layout and a second shape from the target pcell layout. The shape geometry, e.g., a sequence of turns of the shape contour, the respective layer, the position relative to a bounding box of the layout, and other shape properties may be taken into account in this definition. The metric may be beneficial for finding the most suitable shape from the target layout for each shape in the source layout.

Figure 6:
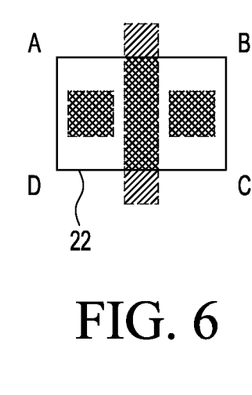
FIG. 6 shows an example of a source shape.
Figure 7:
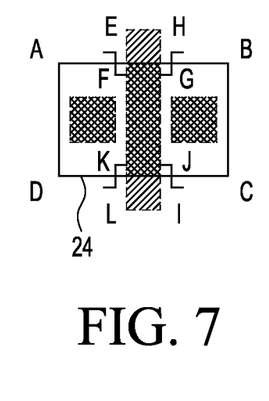
FIG. 7 shows an example of the source shape with new edges added.
Figure 8:
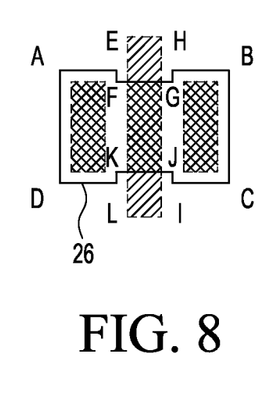
FIG. 8 shows the source shape of FIG. 7 with adjusted edge lengths.

Turning to FIGS. 6, 7, and 8, a shape from the source layout and its transformation into a corresponding shape of the target layout is described. Each edge in the source pcell layout may be associated with a corresponding edge in the target pcell layout. If a shape in the target pcell layout has more edges than the corresponding shape in the source pcell layout, new edges may be added to the respective shape in the source layout. The sequence of corners of the source shape thus becomes identical to the sequence of corners of the target shape. Newly added edges may have zero length. Adding such edges does not alter the geometry of the shape and therefore no connectivity is broken in the process.

In another example (not shown), a source shape and a corresponding target shape may be oriented differently. For instance, the source shape may be an "L" shape and the corresponding target shape may be an "L" shape rotated by ninety degrees. Also in this example, new edges may be inserted to the source shape.

The length of newly added edges or, equivalently, the positions of newly added corners may be adjusted in the smart legalization procedure (block 4.3 and FIG. 4). The positions of the original corners of the source shape may also be adjusted during the smart legalization procedure.

In the example of FIGS. 6, 7, and 8, the source shape 22 is a rectangle with corners A, B, C, and D, whereas the corresponding target shape 26 is a polygon with twelve corners A to L. The sequence of source corners, i.e., the sequence A, B, C, D of the corners of the source shape 22, may be transformed as follows, for example, in block 4.2 of FIG. 4. Having found a correspondence between shapes, a correspondence between edges of a given source shape and the corresponding target shape may be established. For example, the edges AB, BC, CD, and DA of the source shape 22 may be assigned to the edges HB, BC, CI, and DA, respectively. This assignment may, for example, be performed by means of a LCS algorithm. These edges of the target shape may then be created in the source shape. In the present example, the edges AE, EF, FG, and GH may thus be created in the source shape between the edges DA and HB. Similarly, the edges IJ, JK, KL, and LD may be created between the edges CI and DA. Some of the newly created edges may have a length that is zero. In the present example, the following newly created edges have a length that is zero: EF, GH, IJ, and KL (see FIG. 7). In the subsequent legalization operation, the length of all or at least some of the edges may then be adapted.

The correspondence between edges may be provided, for example, in the form of a data structure containing the following a mapping between edges of corresponding shapes in source and target pcells, and coordinates of edges in the target layout This data structure may then be used during the smart legalization process for a smooth transformation of source pcells.

It is noted that prior art methods of layout legalization may preserve the source layout connectivity. However, these methods appear to be incapable of fixing connectivity violations resulting from pcell swapping.

The smart legalization procedure described herein may be seen as a modification of the prior art layout legalization. Legalization methods are well-known and may be based on constraint graph algorithms, for example. The present modification may include creating additional constraints for a smooth pcell transformation driven by the source and target pcell shape correspondence.

Referring back to FIGS. 6, 7, and 8 and the description thereof, it is noted that the operation of adding new edges to a source shape may equivalently be described as an operation of adding new corners to the source shape. For example, now referring to the specific example shown in FIGS. 6, 7, and 8, the original corners A, B, C, and D may be retained, and new corners E, F, G, H, I, J, K, L may be added to the source shape. The described example of adding new edges is thus equivalent to replacing the original list of corners A, B, C, D by a new list of corners A, B, C, D E, F, G, H, I, K, L. Lengths of all pcell shape edges may be controlled by additional constraints. The numerical values for the additional constraints may be obtained from the target shape by using the correspondence between source and target edges.

In the present method, all geometry changes may be carried out in the legalization procedure to ensure connectivity and conformity to design rules. Merging cut shapes may be an exception from this; it may be a special case. If new edges have zero length, the input layout geometry is not changed.

In a case in which the source shape has more edges than the target shape, new edges may be added to target shape to ensure that the number of edges is the same for the source shape and the target shape. In the transformed layout, some shapes may then have additional zero length edges.

Concerning the shape transformations in the preprocessing stage, it is noted that preprocessing may involve, for example, layer swapping and other operations such as scaling or merging cuts. These operations are, however, not the focus of the present application.

The shape edge correspondence may be found independently for each pcell. It may involve two operations, namely finding a correspondence between shapes and then finding a correspondence between edges. The correspondence between shapes may be found using a LCS algorithm. In this algorithm, a shape similarity metric may be used to compare shapes.

The first operation, i.e., that of finding a correspondence between shapes, may result in a mapping between source and target shapes.

The second operation, i.e., the operation of finding a correspondence between edges, may result in an edge correspondence for each pair of a source shape and a target shape. An LCS algorithm may also be used, but it may operate on corners instead of shapes. If a corner is missing in a source or target shape, it may be created. The mapping between corners of source and target shapes may then be converted into a mapping between edges.

Preprocessing is not critical for finding a correspondence between source shapes and target shapes. Merging of cuts in a preprocessing operation may, however, simplify the migration task.

The numerical values of the additional constraints may be obtained from the edge correspondence data. The length of each source edge may be set equal to the length of the corresponding target edge by means of an additional constraint in the smart legalization procedure. For instance, assuming that a certain target edge has a length L_TGT of, e.g., 0.1 mm, the following constraints may be imposed on the length L_SRC of the corresponding source edge:

$L\_SRC \leq L\_TGT$ and $L\_SRC \geq L\_TGT$, or, equivalently:

$L\_SRC = L\_TGT$.

A pcell may be implemented as a script for generating a layout. A layout may comprise shapes and instances of other layouts. Some instances may be pcell instances. A pcell script may generate a pcell layout on demand, for instance, when a user opens a layout in layout editor or when a tool reads a source layout. The methods described above do not require changing any pcell scripts. Instead, the pcell layout generated by a pcell script may be adapted.

If a target shape has fewer edges than the corresponding source shape, all the edges of the source shape may be retained. After the smart legalization, there may then be some zero length edges.

A method of generating a target layout of an integrated circuit may thus comprise: providing a source layout comprising one or more source pcells, each source pcell comprising one or more shapes, each shape having a contour composed of edges; providing a set of connectivity constraints for connecting each shape of each source pcell to none, one, or more other components of the integrated circuit; providing a set of target design constraints; for each shape of each source pcell, determining a corresponding target shape, the target shape having a contour composed of edges with defined lengths; for each shape of each source pcell, inserting none, one, or more edges in the contour of the shape, or in the contour of the corresponding target shape, so as to allow for a one-to-one mapping between the edges of the shape of the source pcell and the edges of the corresponding target shape; for each edge of each shape of each source pcell, determining a corresponding edge of the corresponding target shape; for each edge of each shape of each source pcell, defining an edge length constraint for constraining the edge to have the length of the corresponding edge of the corresponding target shape, thus generating a set of edge length constraints; and applying a legalization procedure to the source layout on the basis of the set of connectivity constraints, the set of target design constraints, and the set of edge length constraints. The legalization procedure may, for example, make use of a constraint graph algorithm. Said other components of the integrated circuit may include one or more of said shapes of said source pcells. The operation of inserting none, one, or more edges in the contour of the shape or into the contour of the corresponding target shape may involve a Longest Common Subsequence (LCS) algorithm. The edges inserted in the contour of the shape or in the contour of the corresponding target shape may notably include one or more zero-length edges. The legalization procedure may further comprise: determining positions or sizes, or both positions and sizes, of the shapes of the source pcells.

The invention may be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may, for instance, include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium.

All or some of the computer program may be provided on transitory or non-transitory computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an."

The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of producing an integrated circuit, the method comprising:
    providing a source layout comprising one or more source pcells, the one or more source pcells comprising a first source pcell, the first source pcell comprising one or more shapes, each shape having a contour composed of edges;
    generating a first target pcell from the first source pcell by:
        providing a set of connectivity constraints for connecting each shape of the first source pcell to none, one, or more other components of the integrated circuit,
        providing a set of target design constraints,
        for each shape of the first source pcell, determining a corresponding target shape of the first target pcell, the target shape having a contour composed of edges with defined lengths,
        for each shape of the first source pcell, inserting none, one, or more edges in the contour of the shape, or in the contour of the corresponding target shape, so as to allow for a one-to-one mapping between the edges of the shape of the first source pcell and the edges of the corresponding target shape, wherein said operation of inserting none, one, or more edges in the contour of the shape or in the contour of the corresponding target shape involves a Longest Common Subsequence algorithm,
        for each edge of each shape of the first source pcell, determining a corresponding edge of the corresponding target shape, and
        for each edge of each shape of the first source pcell, defining an edge length constraint for constraining the edge to have the length of the corresponding edge of the corresponding target shape, thus generating a set of edge length constraints;
    applying a legalization procedure to the source layout on the basis of the set of connectivity constraints, the set of target design constraints, and the set of edge length constraints;
    generating a target layout of the integrated circuit from the source layout based on the legalization procedure, the target layout comprising the first target pcell; and
    fabricating the integrated circuit based on the target layout and the first target pcell.

2. The method of claim 1, wherein the legalization procedure involves a constraint graph algorithm.

3. The method of claim 1, wherein said other components of the integrated circuit include one or more of said shapes of said source pcells.

4. The method of claim 1, wherein said edges inserted in the contour of the shape or in the contour of the corresponding target shape include one or more zero-length edges.

5. The method of 1, wherein the legalization procedure comprises: determining positions or sizes, or both positions and sizes, of the shapes of the source pcells.

* * * * *